US011360032B2

(12) United States Patent
Chuang et al.

(10) Patent No.: US 11,360,032 B2
(45) Date of Patent: Jun. 14, 2022

(54) STRONTIUM TETRABORATE AS OPTICAL COATING MATERIAL

(71) Applicant: KLA Corporation, Milpitas, CA (US)

(72) Inventors: Yung-Ho Alex Chuang, Cupertino, CA (US); Yinying Xiao-Li, San Jose, CA (US); Elena Loginova, Milpitas, CA (US); John Fielden, Los Altos, CA (US)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 17/144,475

(22) Filed: Jan. 8, 2021

(65) Prior Publication Data

US 2021/0131978 A1   May 6, 2021

Related U.S. Application Data

(62) Division of application No. 16/819,991, filed on Mar. 16, 2020, now Pat. No. 10,921,261.
(Continued)

(51) Int. Cl.
*G01N 21/95* (2006.01)
*G01N 21/33* (2006.01)
(Continued)

(52) U.S. Cl.
CPC ......... *G01N 21/9501* (2013.01); *G01N 21/33* (2013.01); *G02B 1/18* (2015.01);
(Continued)

(58) Field of Classification Search
CPC .............. G01N 21/33; G01N 21/9501; G01N 2021/95676; G01N 2201/06113;
(Continued)

(56) References Cited

U.S. PATENT DOCUMENTS 4,335,330 A   6/1982   Peters et al.
4,591,958 A   5/1986   Lamboo
(Continued)

FOREIGN PATENT DOCUMENTS

JP   H10284793 A   10/1998
KR   100709253   4/2007
(Continued)

OTHER PUBLICATIONS

Hiroyuki; Fujiwara., "Spectroscopic Ellipsometry Principles and Applications", Department of Electrical and Electronic Engineering, John Wiley & Sons, Ltd., 2007, 10 pages.
(Continued)

*Primary Examiner* — Mark R Gaworecki
(74) *Attorney, Agent, or Firm* — Bever, Hoffman & Harms, LLP

(57) ABSTRACT

Strontium tetraborate is used as an optical coating material for optical components utilized in semiconductor inspection and metrology systems to take advantage of its high refractive indices, high optical damage threshold and high microhardness in comparison to conventional optical materials. At least one layer of strontium tetraborate is formed on the light receiving surface of an optical component's substrate such that its thickness serves to increase or decrease the reflectance of the optical component. One or multiple additional coating layers may be placed on top of or below the strontium tetraborate layer, with the additional coating layers consisting of conventional optical materials. The thicknesses of the additional layers may be selected to achieve a desired reflectance of the optical component at specific wavelengths. The coated optical component is used in an illumination source or optical system utilized in a semiconductor inspection system, a metrology system or a lithography system.

7 Claims, 7 Drawing Sheets

Related U.S. Application Data

(60) Provisional application No. 62/913,643, filed on Oct. 10, 2019, provisional application No. 62/845,496, filed on May 9, 2019.

(51) Int. Cl.
  *G02B 21/00* (2006.01)
  *G02B 5/28* (2006.01)
  *G02B 21/18* (2006.01)
  *G02B 21/16* (2006.01)
  *G02F 1/35* (2006.01)
  *G02F 1/355* (2006.01)
  *G02B 21/06* (2006.01)
  *G02B 1/18* (2015.01)
  *H01L 21/66* (2006.01)

(52) U.S. Cl.
  CPC ......... *G02B 5/285* (2013.01); *G02B 21/0016* (2013.01); *G02B 21/06* (2013.01); *G02B 21/16* (2013.01); *G02F 1/353* (2013.01); *G02F 1/3551* (2013.01); *G01N 2201/06113* (2013.01); *H01L 22/12* (2013.01)

(58) Field of Classification Search
  CPC .......... G02B 1/115; G02B 1/18; G02B 5/283; G02B 5/285; G02B 21/0016; G02B 21/06; G02B 21/14; G02F 1/353; G02F 1/3551; H01L 22/12
  See application file for complete search history.

(56) References Cited

U.S. PATENT DOCUMENTS

| | | | |
|---|---|---|---|
| 5,068,055 A | 11/1991 | Chenot et al. | |
| 5,216,323 A | 6/1993 | Baaten et al. | |
| 5,608,526 A | 3/1997 | Piwonka-Corle et al. | |
| 5,999,310 A | 12/1999 | Shafer et al. | |
| 6,297,880 B1 | 10/2001 | Rosencwaig et al. | |
| 7,006,222 B2 | 2/2006 | Krishnan | |
| 7,474,461 B2 | 1/2009 | Chuang et al. | |
| 7,525,649 B1 | 4/2009 | Leong et al. | |
| 7,705,331 B1 | 4/2010 | Kirk et al. | |
| 7,817,260 B2 | 10/2010 | Chuang et al. | |
| 7,955,531 B1 * | 6/2011 | Khanarian | H01L 51/524 156/60 |
| 7,957,066 B2 | 6/2011 | Armstrong et al. | |
| 9,080,971 B2 | 7/2015 | Kandel et al. | |
| 9,179,774 B2 | 11/2015 | Kessell et al. | |
| 9,228,943 B2 | 1/2016 | Wang et al. | |
| 9,255,887 B2 | 2/2016 | Brunner | |
| 9,470,639 B1 | 10/2016 | Zhuang et al. | |
| 9,645,287 B2 | 5/2017 | Brunner | |
| 9,709,510 B2 | 7/2017 | Kolchin et al. | |
| 9,723,703 B2 | 8/2017 | Bezel et al. | |
| 9,726,617 B2 | 8/2017 | Kolchin et al. | |
| 9,865,447 B2 | 1/2018 | Chuang et al. | |
| 9,891,177 B2 | 2/2018 | Vazhaeparambil et al. | |
| 2006/0237689 A1 | 10/2006 | Fan et al. | |
| 2007/0284601 A1 * | 12/2007 | Khanarian | H01L 33/52 257/E33.059 |
| 2011/0309738 A1 | 12/2011 | Dutta et al. | |
| 2015/0192858 A1 | 7/2015 | Van De Kerkhof | |
| 2015/0372446 A1 | 12/2015 | Chuang et al. | |
| 2016/0011523 A1 | 1/2016 | Singh et al. | |
| 2016/0252465 A1 | 9/2016 | Van De Kerkhof | |
| 2016/0258810 A1 | 9/2016 | Van Der Post | |
| 2016/0377990 A1 | 12/2016 | Quintanilha | |
| 2017/0176714 A1 | 6/2017 | Van Der Zouw | |
| 2018/0034227 A1 | 2/2018 | Trull-Silvestre et al. | |
| 2018/0188658 A1 | 7/2018 | Van Der Post et al. | |
| 2018/0284623 A1 | 10/2018 | Tel et al. | |
| 2019/0064653 A1 | 2/2019 | Van Witteveen et al. | |

FOREIGN PATENT DOCUMENTS

| | | | | |
|---|---|---|---|---|
| WO | WO-2018015283 A1 * | 1/2018 | ............. | C08G 77/26 |
| WO | WO-2018015284 A1 * | 1/2018 | ............. | C08G 77/12 |

OTHER PUBLICATIONS

Yu; S. Oseledchik et al, "New nonlinear optical crystals: strontium and lead tetraborates", Optical Materials 4, Elsevier Science B.V., Jun. 20, 1994, 669-674.

* cited by examiner

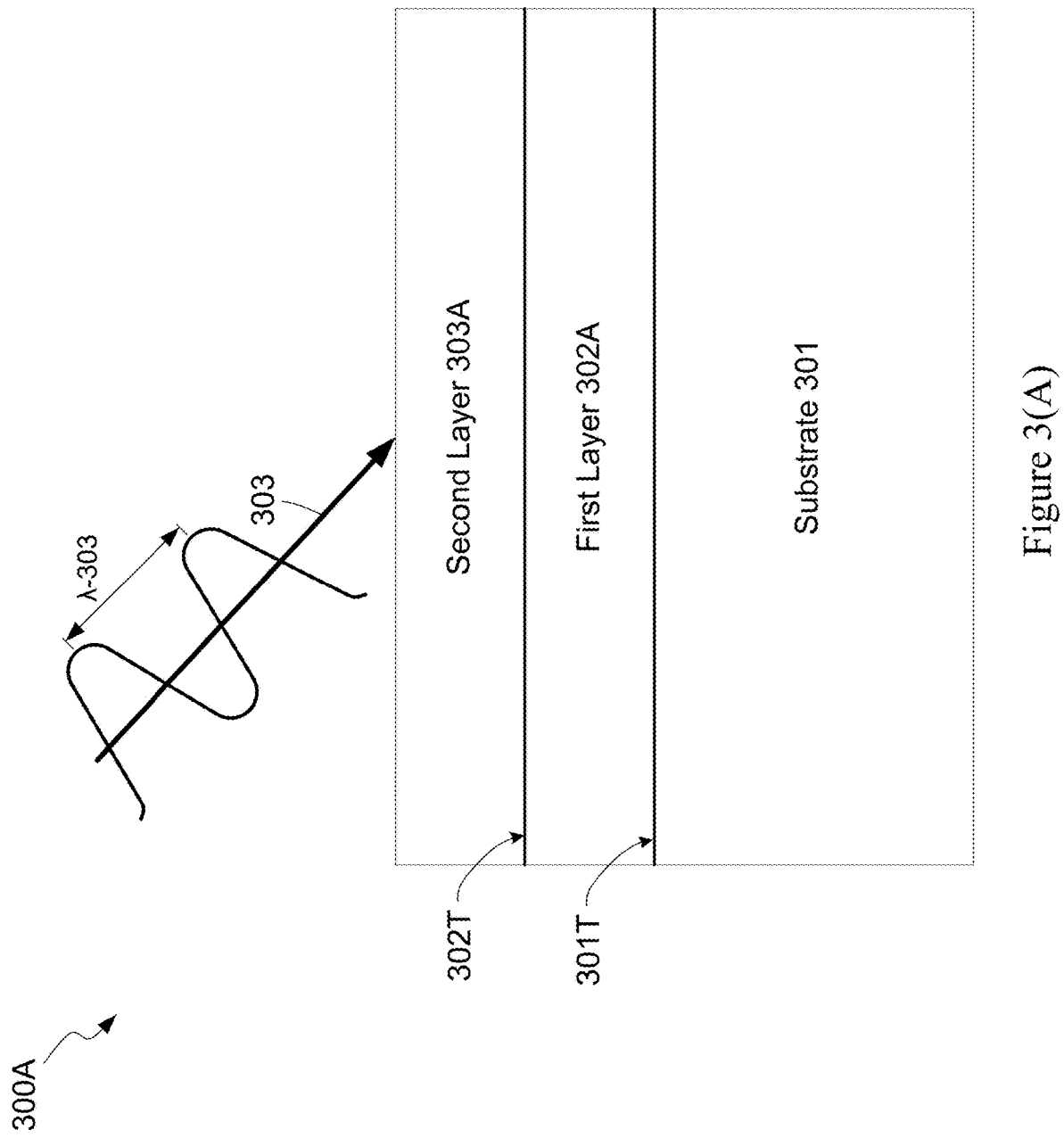

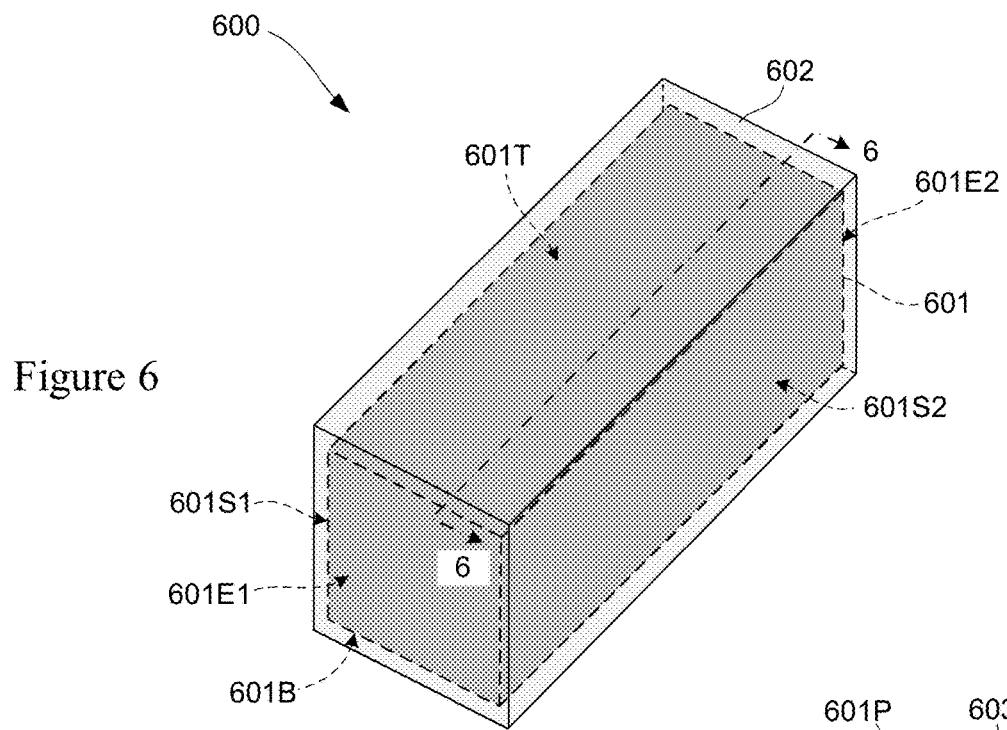
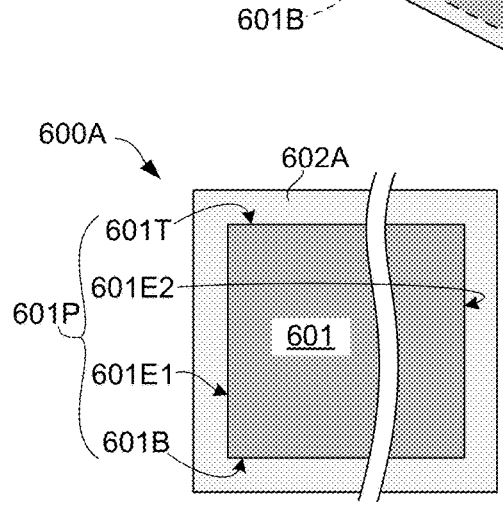
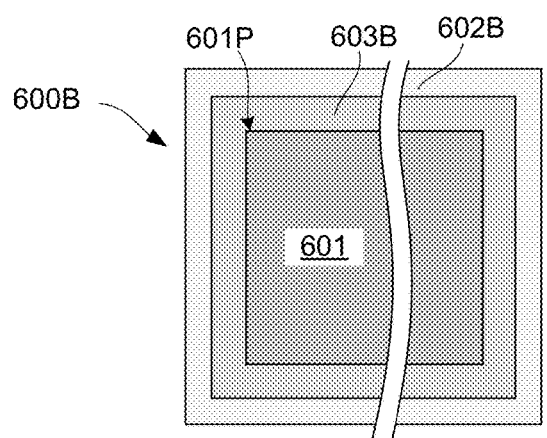
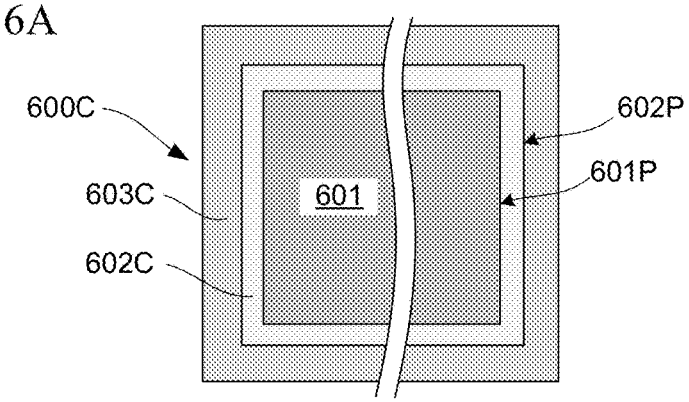
Figure 6
Figure 6A
Figure 6B
Figure 6C

STRONTIUM TETRABORATE AS OPTICAL COATING MATERIAL

RELATED APPLICATIONS

This application is a divisional of U.S. patent application Ser. No. 16/819,991 entitled "STRONTIUM TETRABORATE AS OPTICAL COATING MATERIAL" filed Mar. 16, 2020, which claims priority to U.S. Provisional Patent Application No. 62/845,496, entitled "STRONTIUM TETRABORATE AS OPTICAL COATING MATERIAL", which was filed on May 9, 2019, and is incorporated by reference herein. This application also claims priority to U.S. Provisional Patent Application No. 62/913,643, entitled "STRONTIUM TETRABORATE AS OPTICAL COATING MATERIAL", which was filed on Oct. 10, 2019, and is incorporated by reference herein.

FIELD OF THE DISCLOSURE

The present disclosure relates generally to systems of a type suitable for use in semiconductor manufacturing (e.g., to inspect and/or measure photomasks, reticles, and semiconductor wafers). In particular, the disclosure relates to optical coating materials for optical components (e.g., mirrors, lenses, prisms and lasers) implemented in metrology and inspection systems that utilize infrared, visible light, deep ultraviolet (DUV) and vacuum ultraviolet (VUV) radiation.

BACKGROUND OF THE DISCLOSURE

The integrated circuit industry requires inspection tools with increasingly higher sensitivity to detect ever smaller defects and particles whose sizes may be a few tens of nanometers (nm), or less. These inspection tools must operate at high speed in order to inspect a large fraction, or even 100%, of the area of a photomask, reticle, or wafer, in a short period of time. For example, inspection time may be one hour or less for inspection during production or, at most, a few hours for R&D or troubleshooting. In order to inspect so quickly, inspection tools use pixel or spot sizes larger than the dimensions of the defect or particle of interest and detect just a small change in signal caused by a defect or particle. Detecting a small change in signal requires a high light level and a low noise level. High speed inspection is most commonly performed in production using inspection tools operating with ultraviolet (UV) light. Inspection in R&D may be performed with UV light or with electrons.

The integrated circuit (IC) industry also requires high precision metrology tools for accurately measuring the dimensions of small features down to a few nanometers or less on semiconductor wafers. Metrology processes are performed on wafers at various points in a semiconductor manufacturing process to measure a variety of characteristics of the wafers such as a width of a patterned structure on the wafer, a thickness of a film formed on the wafer, and overlay of patterned structures on one layer of the wafer with respect to patterned structures on another layer of the wafer. These measurements are used to facilitate process controls and/or yield efficiencies in the manufacture of semiconductor dies. Metrology may be performed with UV light or with electrons.

The semiconductor industry, which is aimed at producing integrated circuits with higher integration, lower power consumption and lower costs, is one of the main drivers of UV optics. The development of powerful UV light sources such as the excimer lasers and frequency multiplied solid state lasers has led to the growth of research and development efforts in the field of UV photon applications.

An optical coating is a layer or several thin layers of material deposited on an optical component such as a mirror or lens, which alters the way in which the optical component reflects and transmits light. One type of optical coating is an antireflection coating (ARC), which reduces undesired reflections from optical surfaces. Optical coatings are ubiquitous in semiconductor inspection and metrology. They are found in most inspection and metrology systems, from reflection and transmission optics such as mirrors, lenses, beam splitters, and prisms, plasma arc lamp coatings, to crystal coatings and laser cavity coatings in deep ultraviolet (DUV) and vacuum ultraviolet (VUV) lasers.

Optical coatings in the DUV (~200 nm to 280 nm) and VUV (~100 nm to 200 nm) spectral ranges are challenging. DUV/VUV lasers may have high power levels from several milli-watts (mW) to ten or more watts (W) and high photon energy (for example 6.5 eV at 193 nm and 4.66 eV at 266 nm). Pulsed lasers may have short pulse lengths (ns or less) and high repetition rates (tens of kHz or greater). Optical coatings, in addition to being transparent in the DUV/VUV wavelength ranges, need to withstand these extreme conditions with high optical damage threshold, high hardness and good stability.

There are a few coatings known in the art suitable for DUV and VUV wavelengths. Among them, the most widely and commonly used is a magnesium fluoride ($MgF_2$) coating. $MgF_2$ is transparent over a wide range of wavelengths. Optical elements such as lenses, mirrors, prisms, windows etc. coated with $MgF_2$ can be transparent from 121 nm (hydrogen Lyman-alpha line) in the VUV to 8.0 μm in the infrared. $MgF_2$ is used mostly for UV optics and in particular for excimer laser applications. Due to its low refractive index of 1.37, thin layers of $MgF_2$ are widely used on optical element surfaces as inexpensive anti-reflection coatings. Crystalline $MgF_2$ is usually quite tough and works and polishes well when used to create components such as windows or lenses. However, $MgF_2$ coatings, which are necessarily amorphous, may not be stable as time goes by. Furthermore, they can be slightly porous. Fluorine tends to escape from the coating surfaces and magnesium oxide can be formed on either surface. Furthermore, $MgF_2$ coatings have a low optical damage threshold (~0.1 $GW/cm^2$). Other materials such as hafnium oxide ($HfO_2$), silicon dioxide ($SiO_2$) and aluminum oxide ($Al_2O_3$) coatings can also be used as optical coatings, but they are only transparent for wavelengths longer than about 200 nm.

While significant interest in producing stable coating surfaces under VUV and DUV illuminations has existed for several decades, $MgF_2$ coating, despite its disadvantages, remains the only convenient coating especially for the VUV wavelength range. For the present application of high-speed inspection and metrology, optical coatings need to have high optical damage threshold, high hardness and good stability. It is further desired that such coatings have low permeability to diffusion of water and oxygen in order to reduce oxidation of the substrate or underlying layers.

What is therefore needed is an optical coating material that overcomes some, or all, of the limitations of the prior art.

SUMMARY OF THE DISCLOSURE

The present disclosure is directed to the use of strontium tetraborate ($SrB_4O_7$) as an optical coating layer for optical components utilized in various systems that utilize the optical components to direct light (radiation) in the range of about 100 nm to about 700 nm or longer.

Strontium tetraborate exhibits optical and mechanical properties that make it uniquely qualified for use as an optical coating material in semiconductor inspection and metrology systems that utilize deep ultraviolet (DUV) and vacuum ultraviolet (VUV) light in the range between 100 nm and 300 nm, and may also be useful in other systems that utilize visible light or infrared (IR) radiation (e.g., optical lithographic systems or IR camera systems). Although the published transparency range of $SrB_4O_7$ is 130 nm to 3200 nm, the present inventors believe a $SrB_4O_7$ optical layer may be suitably transparent to light having wavelengths a little shorter than 130 nm, perhaps to 120-125 nm. The refractive indices of $SrB_4O_7$ are high compared with conventional optical coating materials such as $MgF_2$. The optical damage threshold is very high (14.7 $GW/cm^2$) compared with other coating materials such as $MgF_2$. The microhardness of $SrB_4O_7$ is also high (1750 $kg/mm^2$ in the x direction, 1460 $kg/mm^2$ in the y direction and 1350 $kg/mm^2$ in the z direction). The high optical damage threshold and microhardness allow $SrB_4O_7$ coatings to withstand the extreme conditions occurring within a semiconductor inspection and metrology system, especially systems that utilize DUV and VUV radiation. That is, the DUV and VUV lasers utilized in semiconductor inspection and metrology systems often have high power levels from several milli-watts (mW) to several watts (W) or more, and high photon energy (for example 6.5 eV at 193 nm and 4.66 eV at 266 nm). Pulsed lasers may have short pulse lengths (ns or less) and high repetition rates (tens of kHz or greater). By providing such systems with optical components having an optical coating layer consisting essentially of strontium tetraborate (i.e., at least 99% of the layer is $SrB_4O_7$) that is operably disposed on the component's substrate structure, the optical and/or mechanical properties of $SrB_4O_7$ extend the operating lifetime of the optical components, thereby allowing the systems to achieve substantially longer uninterrupted operating periods and substantially reduced overall operating costs than conventional systems.

In accordance with an exemplary practical embodiment, the present invention is directed to a DUV or VUV semiconductor inspection/metrology system including an illumination (light) source that is configured to generate incident light having a wavelength in the range between 100 nm and 300 nm, and including an optical system that is configured to direct the incident light from a source to a sample, and to direct reflected/scattered light from the sample to a sensor. According to an aspect of the invention, at least one optical component utilized in at least one of the illumination (light) source and the optical system includes a strontium tetraborate ($SrB_4O_7$) optical coating layer that is operably disposed on at least one surface the component's core substrate structure. For example, the strontium tetraborate optical coating layer is formed over a light-receiving (top) surface of the component's substrate such that incident light or reflected/scattered light that is directed toward the light-receiving surface necessarily passes through the strontium tetraborate optical coating layer before reaching the light-receiving surface. In alternative embodiments, the optical component can be of any type utilized in the illumination source or optical system of an inspection and metrology system, including reflection and transmission optical components (e.g., mirrors, lenses, windows, beam splitters, polarizers and prisms), plasma arc lamps, frequency conversion crystals and laser cavities. By providing one or more $SrB_4O_7$ optical coating layers on at least one of these optical components, the mechanical properties of $SrB_4O_7$ provide enhanced protection of underlying optical materials (i.e., as compared to a similar optical component utilizing only conventional optical coating materials), thereby increasing the optical component's effective lifetime, which in turn increases the length of uninterrupted operating periods and reduces the overall operating costs of the host DUV/VUV semiconductor inspection/metrology system.

In some single layer embodiments the $SrB_4O_7$ optical coating layer is formed directly on a top (light receiving) surface of an optical component's base material (generally referred to as a substrate). In these embodiments the optical component's reflectivity (i.e., the amount of incident light that is reflected) is adjustable by way of adjusting the thickness of the $SrB_4O_7$ optical coating layer. In one embodiment, the $SrB_4O_7$ optical coating layer is formed in a manner that minimizes the reflected amount of DUV/VUV light away from the top surface of the substrate (e.g., by forming the $SrB_4O_7$ optical coating layer with a thickness equal to one-half of the wavelength of the light in the optical coating layer of the received light, whereby destructive interference occurs for the reflected beams when light is incident on the coated optics, and thus the reflectance of the component is greatly reduced at, at least, a wavelength of interest). In another embodiment, the $SrB_4O_7$ optical coating layer is formed in a manner that maximizes the reflected amount of DUV/VUV light away from the top surface of the substrate. To facilitate both increased or decreased reflectivity in DUV or VUV semiconductor inspection and metrology systems, the $SrB_4O_7$ optical coating layer is formed with a thickness in a range between 30 nm and 200 nm. Utilizing a single $SrB_4O_7$ optical coating layer takes advantage of both the optical and mechanical properties of $SrB_4O_7$, thereby providing the extending component lifetime benefits mentioned above while minimizing component production costs (i.e., by utilizing the optical properties of $SrB_4O_7$ to provide the desired optical coating characteristics (e.g., reflectivity), thereby avoiding the additional production costs that would be associated with the formation of one or more additional optical material layers that would otherwise be needed to provide the desired optical coating characteristics).

In other embodiments optical components include multiple optical coating layers formed on the optical component's substrate, where at least one layer of the multi-layer coating consists essentially of $SrB_4O_7$. In some specific embodiments the $SrB_4O_7$ optical coating layer forms the outermost coating layer of the component's multi-layer optical coating structure (i.e., such that one or more conventional (second) optical coating layers are formed between the $SrB_4O_7$ optical coating layer and the top surface of the substrate). In some embodiments, the one or more conventional optical material layers comprise one or more conventional optical coating materials such as hafnium oxide, aluminum oxide, silicon dioxide, aluminum fluoride and/or magnesium fluoride. This arrangement may be utilized to prolong the effective lifetime of an optical component by utilizing the enhanced mechanical properties of the $SrB_4O_7$ layer to shield the underlying conventional optical coating layer(s). In other embodiments, one or more conventional (third) optical material layers may be formed over the $SrB_4O_7$ optical coating layer to facilitate beneficial optical qualities that might be gained from this arrangement, while utilizing the enhanced mechanical properties of the $SrB_4O_7$ layer to protect underlying conventional (second) optical material layers and/or the substrate. In yet other embodiments, the $SrB_4O_7$ optical coating layer is formed directly on the top surface of the substrate, and one or more conventional (second) optical material layer(s) are formed over the ($SrB_4O_7$) optical material layer, thereby utilizing the enhanced mechanical properties of the $SrB_4O_7$ layer to protect only the substrate.

In some embodiments the $SrB_4O_7$ layer covers multiple (e.g., top and opposing bottom) surfaces of a substrate structure, and in other embodiments the $SrB_4O_7$ layer extends over all outer peripheral substrate surfaces to form a continuous encapsulating structure that entirely surrounds the substrate structure. In some embodiments, an inspection or metrology system includes a laser in its light source, the laser including a frequency conversion crystal configured to generate a deep UV wavelength, such as a wavelength shorter than 300 nm. The substrate of such frequency conversion crystals often comprises a hygroscopic non-linear optical material such as cesium lithium borate (CLBO) or cesium borate (CBO). The continuous $SrB_4O_7$ encapsulating structure configuration facilitates the generation of improved frequency conversion crystals by utilizing the enhanced mechanical properties of the $SrB_4O_7$ layer to slow or stop the diffusion of water and/or oxygen into the hygroscopic non-linear optical material, thus enabling the crystal to be stored, shipped and operated in a higher humidity environment than would otherwise be possible. In some embodiments desirable optical characteristics may be achieved using optional conventional optical coating material layer(s) that are either disposed inside or outside of the continuous $SrB_4O_7$ encapsulating structure.

Semiconductor inspection tools must operate at high speed in order to inspect a large fraction, or even 100%, of the area of a photomask, reticle, or wafer, in a short period of time. For example, inspection time may be one hour or less for inspection during production or, at most, a few hours for R&D or troubleshooting. In order to inspect so quickly, inspection tools use pixel or spot sizes larger than the dimensions of the defect or particle of interest, and detect just a small change in signal caused by a defect or particle. High speed inspection is most commonly performed in production using inspection tools operating with ultraviolet (UV) light. High precision metrology tools are required for accurately measuring the dimensions of small features down to a few nanometers or less on semiconductor wafers. Metrology processes are performed on wafers at various points in a semiconductor manufacturing process to measure a variety of characteristics of the wafers such as a width of a patterned structure on the wafer, a thickness of a film formed on the wafer, and an overlay offset of patterned structures on one layer of the wafer with respect to patterned structures on another layer of the wafer. These measurements are used to facilitate process controls and/or yield efficiencies in the manufacture of semiconductor dies. High-speed inspection and metrology require high light levels and a stable signal. Optical coatings that reduce the reflection losses of transmissive optics and increase the reflection of reflective optics increase the light available at the sensor and thus allow for higher sensitivity and higher speed. Coatings that do not degrade, or degrade more slowly than existing coatings, can result in a more stable signal making it easier to detect small changes in signal. Such coatings also can reduce the operating cost of an inspection or metrology tool by reducing the frequency of replacement of optical components.

BRIEF DESCRIPTION OF THE DRAWINGS

The present disclosure is illustrated by way of example, and not by way of limitation, in the figures of the accompanying drawings in which:

FIGS. 3A and 3B illustrate exemplary simplified optical components including exemplary multi-layer optical coating structures in which at least one of the layers consists essentially of $SrB_4O_7$ according to an alternative embodiments of the present disclosure;

FIG. 6 illustrates an exemplary frequency conversion crystal comprising a hygroscopic non-linear crystal material (e.g., CBO or CLBO) that is entirely coated by a $SrB_4O_7$ optical material layer according to another embodiment of the present invention; and FIGS. 6A, 6B and 6C are cross-sectional side views respectively illustrate alternative single-layer and multi-layer optical coating structures according to alternative specific embodiment of the present invention.

DETAILED DESCRIPTION OF THE DISCLOSURE

Although the claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

The following description is presented to enable one of ordinary skill in the art to make and use the disclosure as provided in the context of a particular application and its requirements. As used herein, directional terms such as "top," "bottom," "over," "under," "upper," "upward," "lower," "down," and "downward" are intended to provide relative positions for purposes of description and are not intended to designate an absolute frame of reference. Various modifications to the preferred embodiment will be apparent to those with skill in the art, and the general principles defined herein may be applied to other embodiments. Therefore, the present disclosure is not intended to be limited to the particular embodiments shown and described but is to be accorded the widest scope consistent with the principles and novel features herein disclosed.

Figure 1:
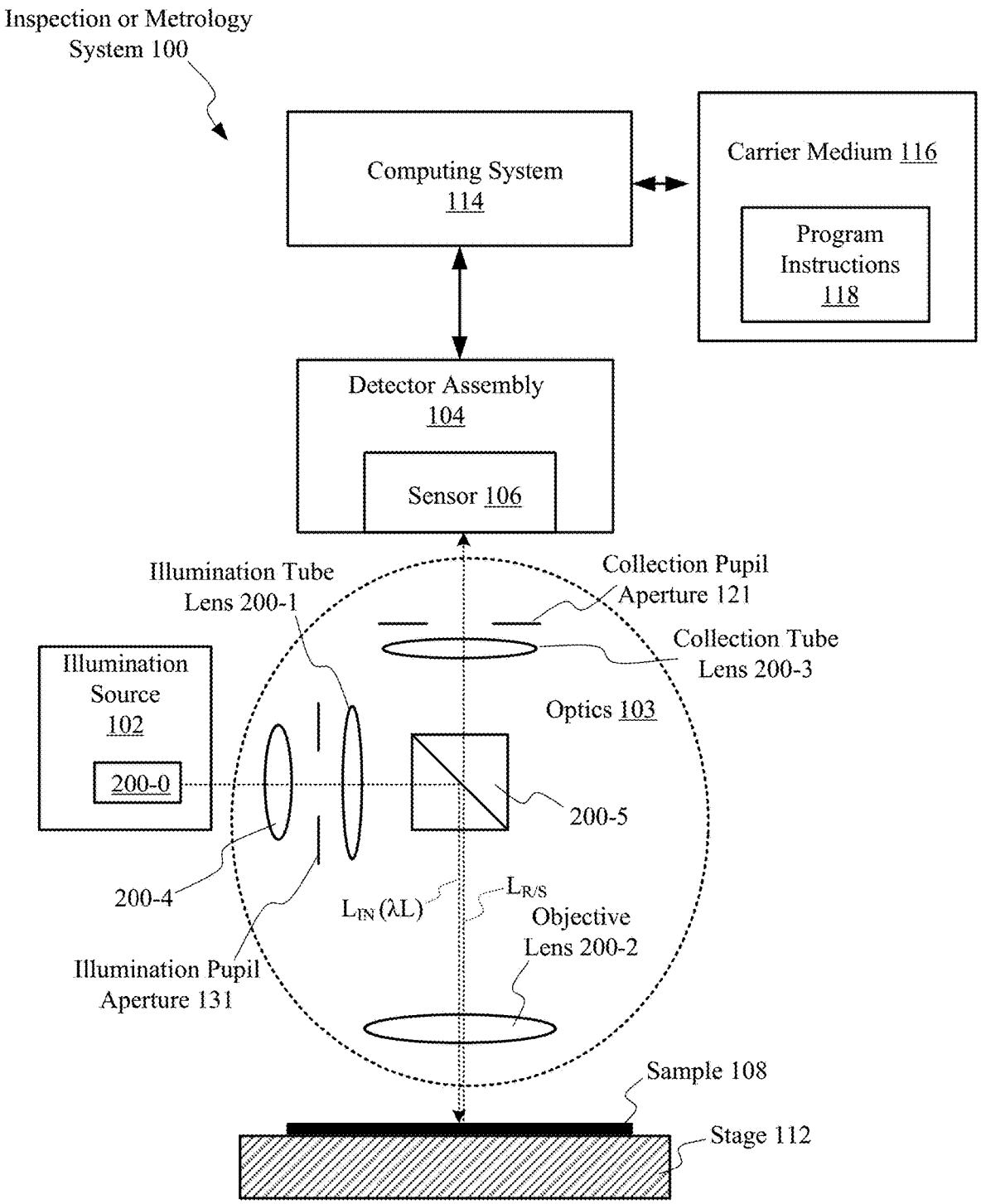
FIG. 1 illustrates an exemplary inspection or metrology system implementing one or more optical components that include at least one $SrB_4O_7$ optical material layer in accordance with an embodiment of the present invention.

FIG. 1 illustrates an exemplary inspection or metrology system 100 configured to inspect or measure a semiconductor-fabrication-related sample 108, such as a silicon wafer, a reticle, or photomask. System 100 generally includes an illumination (light) source 102, a sensor 106 and a stage 112.

Illumination source 102 is preferably configured to generate (emit) deep UV (DUV) and/or vacuum UV (VUV) incident light (radiation) $L_{IN}$ having a wavelength in the range of 100 nm to 300 nm but may be configured to generate light having wavelengths greater than 300 nm. In some embodiments illumination source 102 utilizes one or more lasers and one or more optical components (e.g., a frequency converter 200-0) to generate incident light $L_{IN}$. In one embodiment, illumination source 102 may be a continuous source, such as an arc lamp, a laser-pumped plasma light source, or a continuous wave (CW) laser. In another embodiment, illumination source 102 may be a pulsed source, such as a mode-locked laser, a Q-switched laser, or a plasma light source pumped by a mode-locked or Q-switched laser. Suitable light sources that may be included in illumination source 102 are described in U.S. Pat. No. 7,705,331, entitled "Methods and systems for providing illumination of a specimen for a process performed on the specimen", to Kirk et al., U.S. Pat. No. 9,723,703, entitled "System and method for transverse pumping of laser-sustained plasma", to Bezel et al., and U.S. Pat. No. 9,865,447, entitled "High brightness laser-sustained plasma broadband source", to Chuang et al. These patents are incorporated by reference herein.

Stage 112 is configured to receive sample 108 and to facilitate movement of sample 108 relative to optical system 103 (i.e., such that optical system 103 focuses incident light $L_{IN}$ on different regions of sample 108). Stage 112 may comprise an X-Y stage or an R-θ stage. In one embodiment, stage 112 can adjust the height of sample 108 during inspection to maintain focus. In another embodiment, optics 103 can be adjusted to maintain focus.

Optical system (optics) 103 comprises multiple optical components and other optical components that are configured to direct and focus incident light $L_{IN}$ onto sample 108, and to direct reflected (including scattered) light $L_{R/S}$ from the sample 108 to sensor 106. The optical components of optical system 103 illustrated in FIG. 1 includes an illumination tube lens 200-1, an objective lens 200-2, a collection tube lens 200-3, a condensing lens 200-4 and a beam splitter 200-5.

During the operation of system 100 incident light $L_{IN}$ leaving illumination source 102 is directed by condensing lens 200-4 and illumination tube lens 200-1 to beam splitter 205, which directs incident light $L_{IN}$ downward through objective lens 200-2 onto sample 108. Reflected light $L_{R/S}$ represents the portion of incident light $L_{IN}$ that is reflected and/or scattered in an upward direction into objective lens 200-2 by the surface features of sample 108, and is directed by objective lens 200-2 and collection tube lens 200-3 to sensor 106. Sensor 106 generates an output signal/data based on the amount of reflected light $L_{R/S}$ received from sample 108. The output of sensor 106 is provided to a computing system 114, which analyzes the output. Computing system 114 is configured by program instructions 118, which can be stored on a carrier medium 116. In one embodiment, computing system 114 controls the inspection or metrology system 100 and sensor 106 to inspect or measure a structure on sample 108. In one embodiment, system 100 is configured to illuminate a line on sample 108 and to collect reflected/scattered light in one or more dark-field and/or bright-field collection channels. In this embodiment, detector assembly 104 may include a time delay and integration (TDI) sensor, a line sensor or an electron-bombarded line sensor.

In one embodiment, illumination tube lens 200-1 is configured to image illumination pupil aperture 131 to a pupil stop within objective lens 200-2 (i.e. illumination tube lens 200-1 is configured such that the illumination pupil aperture 131 and the pupil stop are conjugate to one another). Illumination pupil aperture 131 may be configurable, for example, by switching different apertures into the location of illumination pupil aperture 131, or by adjusting a diameter or shape of the opening of illumination pupil aperture 131. In this way, sample 108 may be illuminated by different ranges of angles depending on the measurement or inspection being performed under control of computing system 114.

In one embodiment, collection tube lens 200-3 is configured to image the pupil stop within objective lens 200-2 to collection pupil aperture 121 (i.e. collection tube lens 200-3 is configured such that the collection pupil aperture 121 and the pupil stop within objective lens 200-2 are conjugate to one another). Collection pupil aperture 121 may be configurable, for example, by switching different apertures into the location of collection pupil aperture 121, or by adjusting a diameter or shape of the opening of collection pupil aperture 121. In this way, different ranges of angles of light reflected or scattered from sample 108 may be directed to detector assembly 104 under control of computing system 114.

Either, or both, of illumination pupil aperture 131 and collection pupil aperture 121 may comprise a programmable aperture such as one described in U.S. Pat. No. 9,255,887 entitled "2D programmable aperture mechanism" to Brunner, or to one described in U.S. Pat. No. 9,645,287 entitled "Flexible optical aperture mechanisms" to Brunner. Methods of selecting an aperture configuration for wafer inspection are described in U.S. Pat. No. 9,709,510 "Determining a configuration for an optical element positioned in a collection aperture during wafer inspection" to Kolchin et al., and U.S. Pat. No. 9,726,617 "Apparatus and methods for finding a best aperture and mode to enhance defect detection" to Kolchin et al. All these patents are incorporated by reference herein.

According to an aspect of the invention that is described in additional detail in the specific embodiments provided below, one or more optical components utilized in illumination source 102 and/or in optics 103 includes at least one optical material layer formed on at least one surface of the components' substrate structure, where the optical material layer consists essentially of strontium tetraborate (i.e., at least 99% of the optical material layer is $SrB_4O_7$). For example, in an exemplary specific embodiment at least one of frequency converter 200-0 of illumination source 102 and optical components 200-1 to 200-5 of optical system 103 includes a single strontium tetraborate optical material layer (e.g., as described below with reference to FIG. 2). In another embodiment at least one of frequency converter 200-0 of illumination source 102 and optical components 200-1 to 200-5 of optical system 103 includes a multiple optical material layers, at least one of which consisting essentially of strontium tetraborate (e.g., as described below with reference to FIGS. 3A and 3B). Exemplary materials for the optical material layers other than the $SrB_4O_7$ layer(s) include, for example, hafnium oxide, aluminum oxide, aluminum fluoride and magnesium fluoride. In another embodiment at least one of frequency converter 200-0 of illumination source 102 and optical components 200-1 to 200-5 of optical system 103 includes an $SrB_4O_7$ optical material layer that forms a continuous encapsulating structure that entirely surrounds each optical component's substrate structure (e.g., as described below with reference to FIGS. 6, and 6A to 6C). As described with reference to the specific embodiments provided below, the thickness of the $SrB_4O_7$ layer may be chosen such that destructive interference occurs for a reflected beam when light is incident on the coated optical component, and thus reflectance of the component is reduced. Alternatively, the thickness of the $SrB_4O_7$ layer may be chosen such that constructive interference occurs for a reflected beam, and thus reflectance of the component is enhanced. The overall light throughput of system 100 may be improved by appropriately coating one or more optical components. The lifetime of key optical components may also be improved by the $SrB_4O_7$ coating.

Additional details of various embodiments of inspection or metrology system 100 are described in U.S. Pat. No. 9,891,177, entitled "TDI Sensor in a Darkfield System", to Vazhaeparambil et al., U.S. Pat. No. 9,279,774, entitled "Wafer inspection", to Romanovsky et al., U.S. Pat. No. 7,957,066, entitled "Split field inspection system using small catadioptric objectives", to Armstrong et al., U.S. Pat. No. 7,817,260, entitled "Beam delivery system for laser darkfield illumination in a catadioptric optical system", to Chuang et al., U.S. Pat. No. 5,999,310, entitled "Ultrabroadband UV microscope imaging system with wide range zoom capability", to Shafer et al., U.S. Pat. No. 7,525,649, entitled "Surface inspection system using laser line illumination with two dimensional imaging", to Leong et al., U.S. Pat. No. 9,080,971, entitled "Metrology systems and methods", to Kandel et al., U.S. Pat. No. 7,474,461, entitled "Broad band objective having improved lateral color performance", to Chuang et al., U.S. Pat. No. 9,470,639, entitled "Optical metrology with reduced sensitivity to grating anomalies", to Zhuang et al., U.S. Pat. No. 9,228,943, entitled "Dynamically Adjustable Semiconductor Metrology System", to Wang et al., U.S. Pat. No. 5,608,526, entitled "Focused Beam Spectroscopic Ellipsometry Method and System", to Piwonka-Corle et al., issued on Mar. 4, 1997, and U.S. Pat. No. 6,297,880, entitled "Apparatus for Analysing Multi-Layer Thin Film Stacks on Semiconductors", to Rosencwaig et al., issued on Oct. 2, 2001. All of these patents are incorporated by reference herein.

Figure 2:
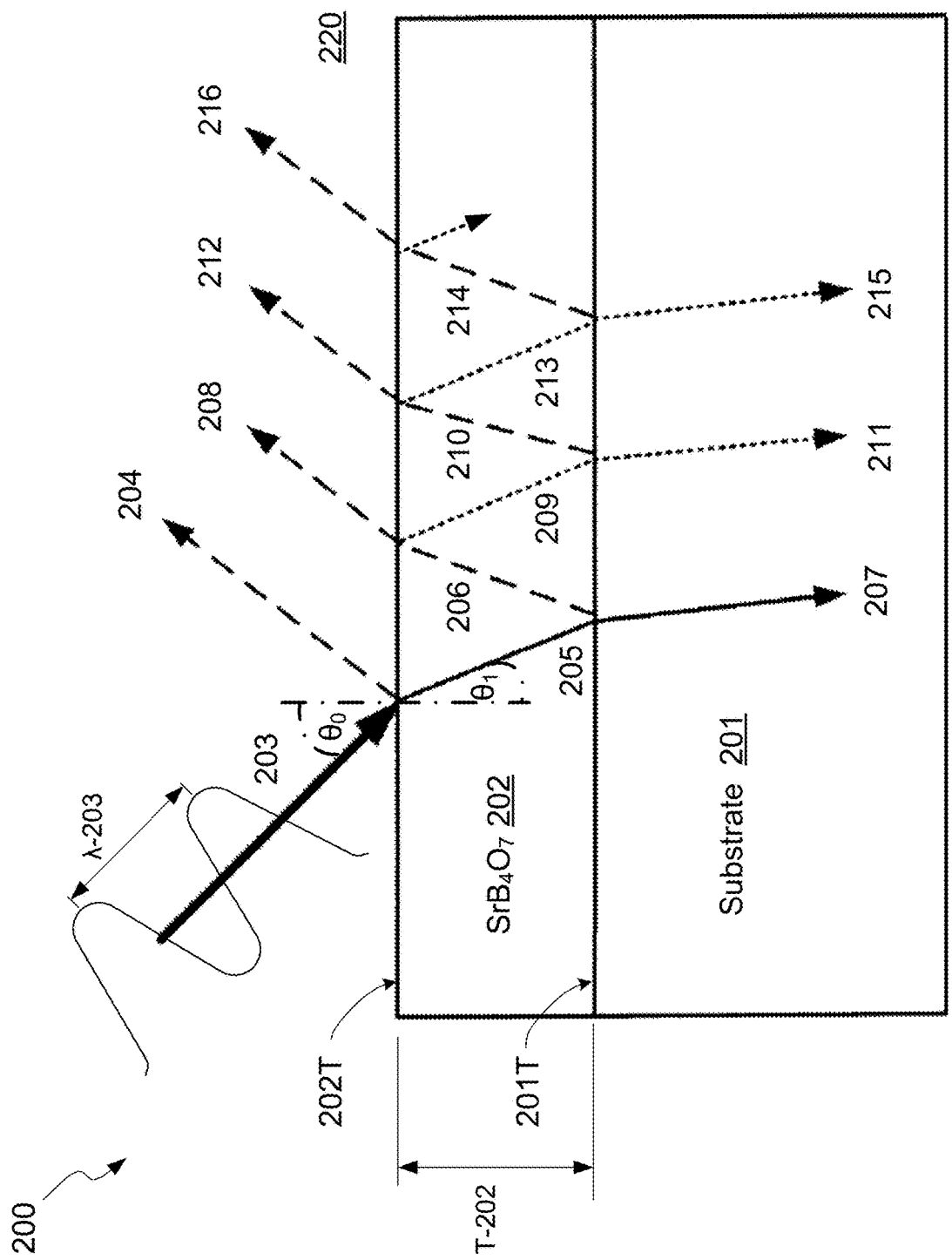
FIG. 2 illustrates a generalized optical component including a single $SrB_4O_7$ optical material layer according to exemplary specific embodiments of the present invention.

FIG. 2 illustrates an exemplary optical component 200 including a single $SrB_4O_7$ optical material layer (coating) 202 formed on a top (light receiving) surface 201T of a substrate 201 according to a first embodiment of the present disclosure. Substrate 201 is depicted in a generalized form for descriptive purposes and may comprise any suitable material and have any form required to implement any optical component found in inspection and metrology systems (e.g., any of components 200-0 to 200-5 shown in FIG. 1). That is, optical component 200 may be of any type capable of implementing reflection or transmission optics such as a mirror, a lens, a beam splitter, a prism, a plasma arc lamp envelope, a nonlinear crystal, and a laser crystal. In one embodiment, $SrB_4O_7$ optical material layer 202 has a thickness T-202 in the range between 30 nm and 200 nm.

When implemented in a host inspection and metrology system, optical component 200 is fixedly maintained within illumination source 102 or optics 103 with its substrate 201 positioned to intercept a light beam portion 203 propagating through external medium 220, which is typically air, an inert purge gas such as nitrogen or argon, or a vacuum. Referring to FIG. 1, depending upon where optical component 200 is implemented, light beam portion 203 may be either incident light $L_{IN}$ or reflected/scattered light $L_{R/S}$. In either case, optical component 200 is oriented such that light beam portion 203 strikes upper surface 202T of $SrB_4O_7$ layer 202 at an angle of incidence $\theta_0$ relative to a normal (depicted by the dashed-dotted line) to surface 202T, and a portion of light beam portion 203 passes through $SrB_4O_7$ layer 202 before reaching top (light receiving) surface 201T of substrate 201. The portion of incident light beam 203 that enters $SrB_4O_7$ layer 202 is refracted by the boundaries (at 202T and 201T) of $SrB_4O_7$ layer 202, as shown by beams 205 and 207. In addition to refraction, some part of incident light beam 203 and refracted light beam 205 is also reflected by these boundaries, as shown by reflected beams 204 and 206. Beam 206 is in turn reflected and refracted at the material boundary (top surface of substrate) 201T, as shown by beams 209 and 208 respectively. Beam 209 is in turn reflected and refracted at the material boundary at 201T, as shown by beams 210 and 211. Beam 210 is reflected and refracted at 202T and so on, leading to an infinite series of internal reflections within $SrB_4O_7$ layer 202 (the first few of which are shown as 206, 209, 210, 213 and 214), an infinite series of downward traveling transmitted beams in substrate 201 (the first few of which are shown as 207, 211 and 215) and an infinite series of upward traveling transmitted beams in external medium 220 (the first few of which are shown as 208, 212 and 216). Note that the refraction/reflection angles and layer thicknesses shown in FIG. 2 are not to scale but are merely used to demonstrate that a single incident light beam can be refracted and reflected multiple times at the boundaries of substrate 201 and $SrB_4O_7$ layer 202. Thus, other refractions and reflections can occur based on beam 214, for example, but are not shown for simplicity. In the embodiments of the inventions disclosed herein, a width of incident beam 203 would typically be many times greater than the thickness T-202 of layer 202 (for example, the width of incident beam might be in the range of several microns to tens of mm, where T-202 might be in the range of tens to hundreds of nm), hence the multiple beams are all substantially spatially overlapped and appear as one reflected beam equal to the sum of all upward travelling beams in medium 220 (i.e. the sum of reflected beam 204 and transmitted beams such as 208, 212 and 216), and one transmitted beam traveling into substrate 201 equal to the sum of all the transmitted beams (i.e. the sum of beams such as 207, 211 and 215).

In one embodiment optical material layer 202 is configured to minimize a reflectivity of optical component 200, thereby minimizing an amount of received light portion 203 that is directed away from the top surface 202T, i.e. minimizing the total power of beams 204, 208, 212, 216 etc. That is, optical material layer 202 is configured such that the sum of the upward-travelling secondary beams in external medium 220 (e.g. beams 208, 212, and 216) is substantially opposite in phase (i.e. a phase difference of substantially 180° or any odd integer multiple of 180°) to reflected beam 204. In one embodiment, the amplitude of reflected beam 204 is approximately equal in amplitude to (e.g. within a range of about 75% of the amplitude to about 150% of the amplitude of) the sum of upward-traveling secondary beams in external medium 220 (e.g. beams 208, 212 and 216), but opposite in phase. When outgoing beam 204 is substantially cancelled by the outgoing secondary beams 208, 212 and 216 etc., destructive interference occurs and the reflectance of the system is considerably reduced, thereby improving the light transmission of optical component 200 and reducing light losses in a system incorporating optical component 200.

It is well known that the amplitude reflectivities $r_p$ and $r_s$ (i.e. complex reflectivities of the electric fields for p and s polarizations respectively) at a wavelength $\lambda$ of a single layer film on a substrate are given by the expressions:

$$r_p = \frac{r_{01,p} + r_{12,p}e^{-i2\beta}}{1 + r_{01,p}r_{12,p}e^{-i2\beta}} \text{ and } r_s = \frac{r_{01,s} + r_{12,s}e^{-i2\beta}}{1 + r_{01,s}r_{12,s}e^{-i2\beta}}$$

where $$\beta = \frac{2\pi T_1}{\lambda}n_1 \cos\theta_1,$$

the phase change when traversing optical material layer 202 once, $$r_{jk,p} = \frac{n_k \cos \theta_j - n_j \cos \theta_k}{n_k \cos \theta_j + n_j \cos \theta_k},$$

the Fresnel reflectivity for p polarized light incident on the interface between layers j and k from the j side, $$r_{jk,s} = \frac{n_j \cos \theta_j - n_k \cos \theta_k}{n_j \cos \theta_j + n_k \cos \theta_k},$$

the Fresnel reflectivity for s polarized light incident on the interface between layers j and k from the j side, $T_j$ represents the thickness of layer j (i.e. $T_1$=T-202 in FIG. 2), $n_j$ represents the refractive index of layer j, $\theta_j$ represents the angle of incidence on the boundaries of layer j (e.g. $\theta_0$ and $\theta_1$ in FIG. 2 for the external medium 220 and the optical material layer 202 respectively), and layer indices j and k=0, 1 and 2 refer respectively to the external medium 220, the optical material layer 202, and the substrate 201. See, for example Fujiwara, "Spectroscopic Ellipsometry, Principles and Applications," pp 43-48 and pp 347-348. Angles of incidence $\theta_1$ in optical material layer 202 and $\theta_2$ in substrate 201 can be calculated from $\theta_0$ (the angle of incidence on surface 202T) by Snell's law.

The intensity or power reflectivity coefficients, $R_p$ and $R_s$, are each equal to the square of the modulus of the amplitude reflectivity coefficient for that polarization:

$$R_p = \left| \frac{r_{01,p} + r_{12,p} e^{-i2\beta}}{1 + r_{01,p} r_{12,p} e^{-i2\beta}} \right|^2 \text{ and } R_s = \left| \frac{r_{01,s} + r_{12,s} e^{-i2\beta}}{1 + r_{01,s} r_{12,s} e^{-i2\beta}} \right|^2$$

In one embodiment, $SrB_4O_7$ layer 202 is formed such that its thickness T-202 operably generates the desired destructive interference at wavelength λ-203 of the received light portion 203. For example, if $r_{01,p}$ and $r_{12,p}$ are real numbers with the same sign (i.e. all materials are substantially non-absorbing at wavelength λ-203 and the phase change at both interfaces is equal), then layer 202 is generated with thickness T-202 approximately equal to one-quarter of the wavelength of the light in optical material 202

$$\left(\text{i.e. } T\text{-}202 \text{ should be approximately equal to } \frac{\lambda - 203}{2 n_1}\right).$$

but it $r_{01,p}$ and $r_{12,p}$ have opposite signs (i.e. all materials are substantially non-absorbing at wavelength λ-203 and the phase change at one interface is 180° relative to that at the other interface), then layer 202 is generated with thickness T-202 approximately equal to one-half of the wavelength of the light in optical material 202

$$\left(\text{i.e. } T\text{-}202 \text{ should be approximately equal to } \frac{\lambda - 203}{4 n_1}\right),$$

since SBO has a refractive index that is higher than that of most commonly used DUV and VUV substrate and non-linear crystal materials (such as fused silica, $CaF_2$ and CLBO), $r_{01,p}$ and $r_{12,p}$ will typically have opposite signs (and similarly for $r_{01,s}$ and $r_{12,s}$), thickness T-202 will need to be equal to approximately a half-wave when SBO is used to coat such materials.

In another embodiment, optical component 200 may be configured to function as a mirror by configuring optical material layer 202 to maximize an amount of received light portion 203 that directed away from the top surface 201T. In this embodiment, thickness T-202 of $SrB_4O_7$ layer 202 may be chosen such that constructive interference can take place so as to enhance the reflectivity of optical component (e.g., layer 202 is generated with thickness T-202 such that at wavelength λ-203, one round trip such transmitted beam 205, the phase change due to reflection at 201T and reflected beam 206 arrive back at surface 202T substantially in phase with reflection 204). This too will reduce light losses in a system incorporating optical component 200 configured as a mirror. If substrate 201 has minimal absorption, i.e. any imaginary part of its refractive index $n_2$ is negligible, then the amplitude reflection coefficients $r_{12,p}$ and $r_{12,s}$ will be substantially real and the phase shifts upon reflection at this interface will be 0° or 180° depending on the signs of $r_{12,p}$ and $r_{12,s}$, and a 360° or 180° phase shift due to thickness T-202 can be chosen as appropriate to give constructive interference at surface 202T to match the phase shifts of $r_{01,p}$ and $r_{01,s}$. Aluminum is a convenient substrate for DUV and VUV mirrors intended for use over a broad range of wavelengths as it has high reflectivity (for example about 90% or higher) throughout the DUV and VUV spectrum. If substrate 201 comprises a metal, such as aluminum, the refractive index of the substrate $n_2$ will be complex. The above equations can be used to calculate the reflectivity, but the amplitude reflectivity coefficients $r_{12,p}$ and $r_{12,s}$ will be complex, i.e. the reflection results in a phase change which is neither 0° or 180°. An appropriate thickness T-202 can be chosen to create constructive interference at surface 202T.

Note that an optical component such as a lens or mirror may have a curved surface. Any radius of curvature will be much larger than the thickness T-202 of layer 202, so the reflectivity at any one location on the surface can be calculated with good accuracy by the above equations. Because of the curvature, the angle of incidence $\theta_0$ of light 203 will vary with location on the surface of the optical component. It may not be possible to achieve minimum or maximum reflectivity at every location on the surface of the optical component. In such a case, the thickness T-202 may be chosen to minimize or maximize, as appropriate, the average reflectivity of the component.

In yet another embodiment, optical component 200 may be configured as a beam splitter. In this embodiment, the thickness of the $SrB_4O_7$ layer may be chosen such that, for example, approximately 50% of the incident light is reflected and approximately 50% transmitted. In another example of a beam splitter, the thickness of the $SrB_4O_7$ layer may be chosen such that one polarization state of the incident light is substantially reflected, and an orthogonal polarization may be substantially transmitted. Other relationships between transmission and reflection of a beam splitter may be chosen depending on the desired application of the beam splitter.

$SrB_4O_7$ crystallizes in the orthorhombic system, $Pnm2_1$, with approximate unit cell dimensions a=4.43 Å, b=10.71 Å, and c=4.23 Å. All boron atoms are coordinated tetrahedrally and an oxygen atom is common to three tetrahedra. Despite the three-dimensional network of tetrahedral, the borate network appears as a layer-like structure since there are relatively fewer links in the c direction of the unit cell.

SrB$_4$O$_7$ exhibits unique optical and mechanical properties. The transparency range of SrB$_4$O$_7$ is 130-3200 nm in wavelength. This broad transmission window makes SrB$_4$O$_7$ a good candidate for optical coating material especially for DUV and VUV wavelength ranges. The refractive indices of SrB$_4$O$_7$ are high compared with other coating materials suitable for VUV wavelengths such as MgF$_2$. For example, the refractive indices at 266 nm are 1.7883 in the x direction, 1.7909 in the y direction and 1.7936 in the z direction. Note that the differences among these refractive indices are small; thus, phase matching processes of second harmonic generation and sum-frequency generation in SrB$_4$O$_7$ are not possible. The optical damage threshold is very high (14.7 GW/cm$^2$) compared with other VUV-transmissive materials such as MgF$_2$. The microhardness of SrB$_4$O$_7$ is also high (1750 kg/mm$^2$ in the x direction, 1460 kg/mm$^2$ in the y direction and 1350 kg/mm$^2$ in the z direction). The high optical damage threshold and microhardness allow SrB$_4$O$_7$ coatings to withstand extreme conditions when exposed to DUV and VUV radiation. DUV and VUV lasers may have high power levels from several milli-watts (mW) to 10 watts (W) or more, and high photon energy (for example 6.5 eV at 193 nm and 4.66 eV at 266 nm). Pulsed lasers may have short pulse lengths (ns or less) and high repetition rates (tens of kHz or greater).

Figure 3B:
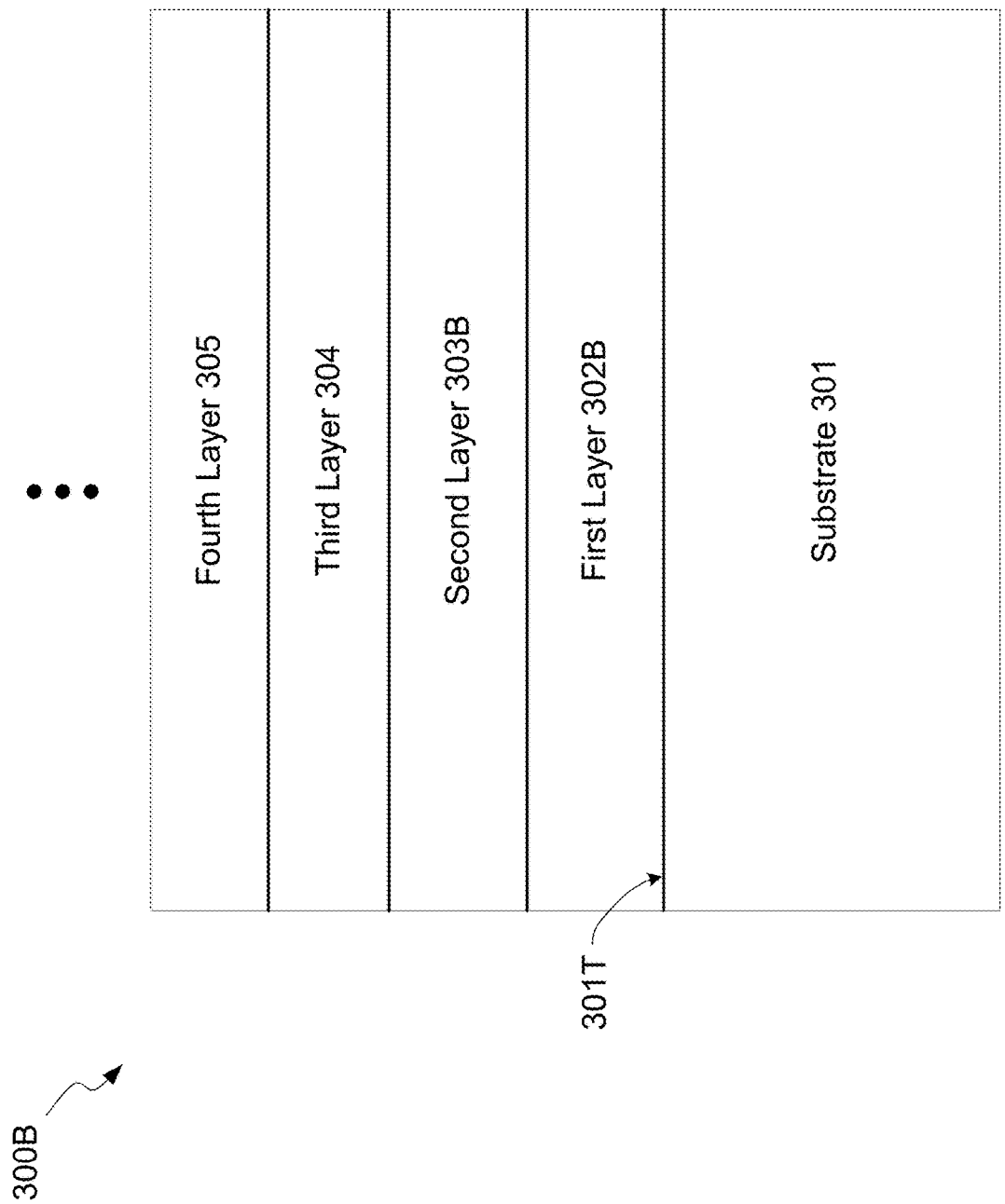

FIGS. 3(A) and 3(B) illustrate exemplary optical components 300A and 300B including multi-layer coatings formed on a top surface 301T of a substrate 301, wherein at least one of the optical material layers forming each multi-layer coating consists essentially of SrB$_4$O$_7$. As mentioned above with reference to FIG. 2, substrate 301 is depicted in a generalized form for descriptive purposes and may comprise any suitable material and form required to implement any optical component found in inspection and metrology systems (e.g., any of components 200-0 to 200-5 shown in FIG. 1). Substrate 301 can be part of any optical component found in inspection and metrology systems, from reflection or transmission optics such as mirrors, lenses, beam splitters, and prisms, plasma arc lamp coatings, to crystal coatings and laser cavity coatings in DUV and VUV lasers.

FIG. 3(A) illustrates an exemplary optical component with two-layer coating including a lower optical material layer 302A disposed on top surface 301T of substrate 301, and an upper optical material layer 303A disposed on an upper surface 302T of lower layer 302A. Substrate 301 is positioned to receive a light portion 303 having a wavelength λ-303 such that a portion of received light portion 303 passes through both lower (first) optical layer 302A and upper (second) optical material layer 303A to top surface 301T of substrate 301. As mentioned above, at least one of layers comprises or consists of SrB$_4$O$_7$. For example, in one embodiment lower optical material layer 302A consists essentially of SrB$_4$O$_7$, and upper optical material layer 303A consists of a conventional optical material (e.g., hafnium oxide, aluminum oxide, silicon dioxide or magnesium fluoride). In another embodiment, lower optical material layer 302A consists of a conventional optical material and upper optical material layer 303A consists essentially of SrB$_4$O$_7$. The thicknesses of each layer 302A and 303A may be chosen to achieve a desired reflectivity or reflectivity bandwidth using skills known in the art. The optical damage threshold and microhardness of the multi-layer coating may be reduced compared with a single SrB$_4$O$_7$ layer but may still be acceptable for optical components used where the UV power density is not too high, such as components that are not in close proximity to the UV light source. The two-layer coating shown in FIG. 3A may be preferred over a single-layer coating (e.g., as shown in FIG. 2) when the two-layer coating can more closely achieve the desired reflectivity or reflectivity bandwidth, and the reduction in damage threshold is acceptable for that component's intended use.

FIG. 3(B) illustrates an exemplary optical component 300B having a multi-layer coating including a lowermost optical material layer 302B formed on top surface 301T of substrate 301, a lower-intermediate optical material layer 303B formed on an upper surface of lowermost layer 302B, a upper-intermediate optical material layer 304 formed on lower-intermediate layer 303B, and an uppermost optical material layer 305 formed on upper-intermediate layer 304. The coating may consist of four layers as shown, or it may include more than four layers (not explicitly shown). At least one of layers 302B, 303B, 304 and 305 consists essentially of SrB$_4$O$_7$, with the remaining layers consisting of a conventional optical material (e.g., hafnium oxide, aluminum oxide, silicon dioxide or magnesium fluoride). In an exemplary embodiment, uppermost layer 305 consists essentially of SrB$_4$O$_7$ to enhance protection of underlying layers 302B, 303B and 304 and substrate 301. The thicknesses of the layers may be chosen to achieve a desired reflectivity or reflectivity bandwidth. The optical damage threshold and microhardness may be reduced compared with a single SrB$_4$O$_7$ layer, but they may still be acceptable for optical components that are not in close proximity to the UV light source or are otherwise subject to low UV power density. A multi-layer coating may be preferred over a single-layer or two-layer coating when the multi-layer coating can more closely achieve the desired reflectivity or reflectivity bandwidth, and the reduction in damage threshold is acceptable for that component.

In some embodiments, the optical component 300B can be coated with alternating high and low refractive index materials, for example first layer 302B and third layer 304 may comprise a high index material, and second layer 303B and fourth layer 305 may comprise a low index material, or alternatively 302B and 304 may comprise a low index material and 303B and 305 may comprise a high index material. The high index material may comprise SrB$_4$O$_7$. The low index material may comprise MgF$_2$ or other material with a refractive index lower than SrB$_4$O$_7$. One of ordinary skill would understand how to choose the number of layers and layer thicknesses in order to achieve a desired reflectivity. Although multi-layer coatings are well known in the art, heretofore no efficient multi-layer coating has been possible for VUV wavelengths because of a lack of a high-index material with low absorption and high damage threshold over a broad range of VUV wavelengths.

Additional coating layers may be placed on top of the optical component 300B. A multi-layer coating may comprise 2, 3, 4, 5 or more layers. Although coatings with alternating pairs of high and low index layers are convenient for making high-reflectivity and low-reflectivity surfaces, other configurations are possible and are within the scope of this invention.

Figure 4:
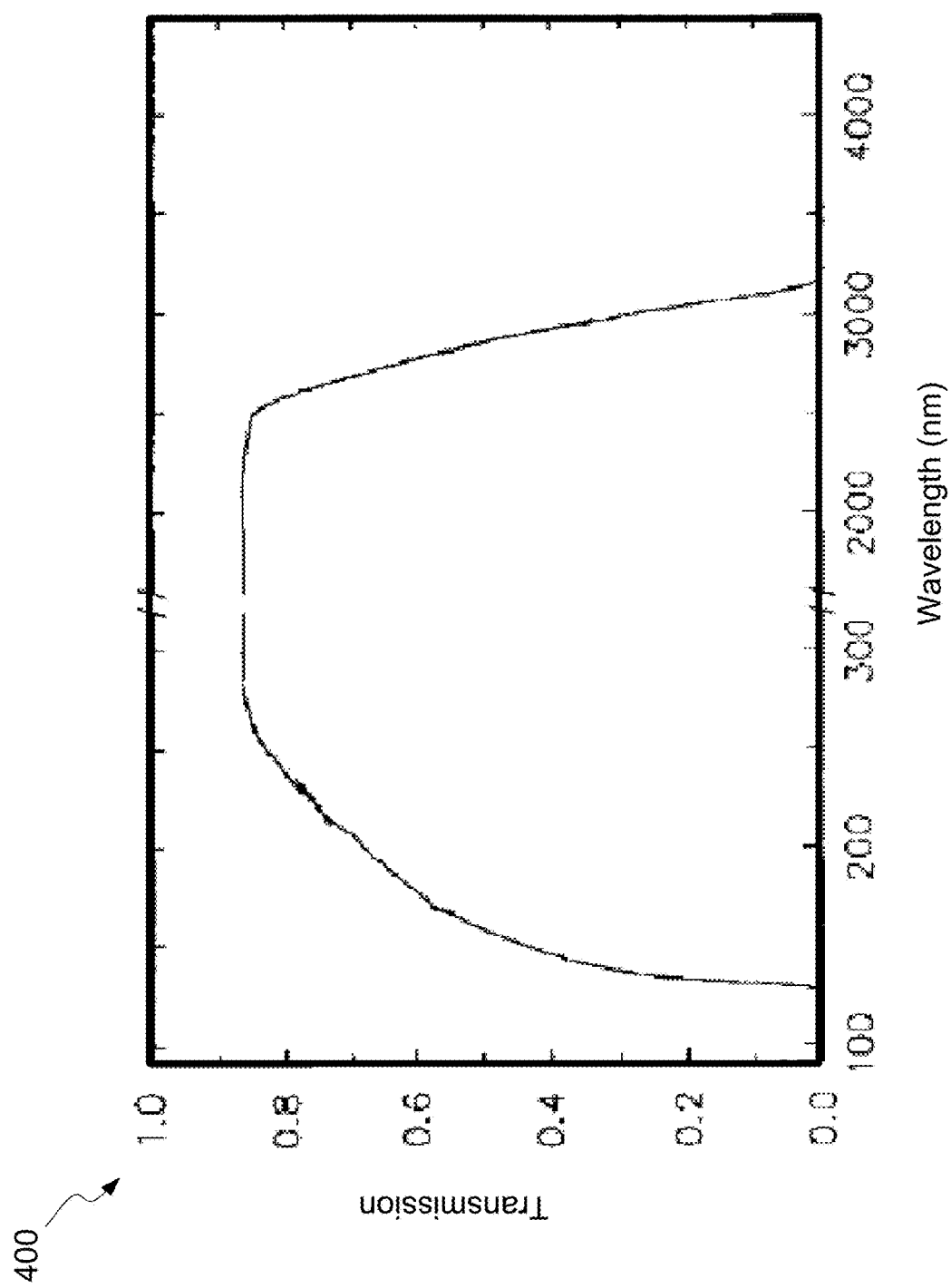
FIG. 4 shows a typical transmission curve of $SrB_4O_7$.

FIG. 4 shows a typical transmission curve of SrB$_4$O$_7$ (Y. S. Oseledchik, A. L. Prosvirnin, A. I. Pisarevskiy, V. V. Starshenko, V. V. Osadchuk, S. P. Belokrys, N. V. Svitanko, A. S. Korol, S. A. Krikunov, and A. F. Selevich, "New nonlinear optical crystals: strontium and lead tetraborates," Opt. Mater. 4, 669 (1995)). As shown in transmission curve 400, the transparency range of SrB$_4$O$_7$ is very broad, namely from about 130 nm to about 3200 nm, which covers VUV, DUV, visible, and near infrared (IR) wavelength ranges. The VUV and DUV ranges are of particular interest to semiconductor inspection and metrology. Various coating designs can be implemented as described above in relation to FIGS. 2, 3(A) and 3(B). It is also noted that the transmittance is high. For instance, the transmittance exceeds 80% from about 250 nm to about 2500 nm. This high transmittance makes $SrB_4O_7$ a good candidate for optical coating materials especially for the UV wavelength range.

Figure 5:
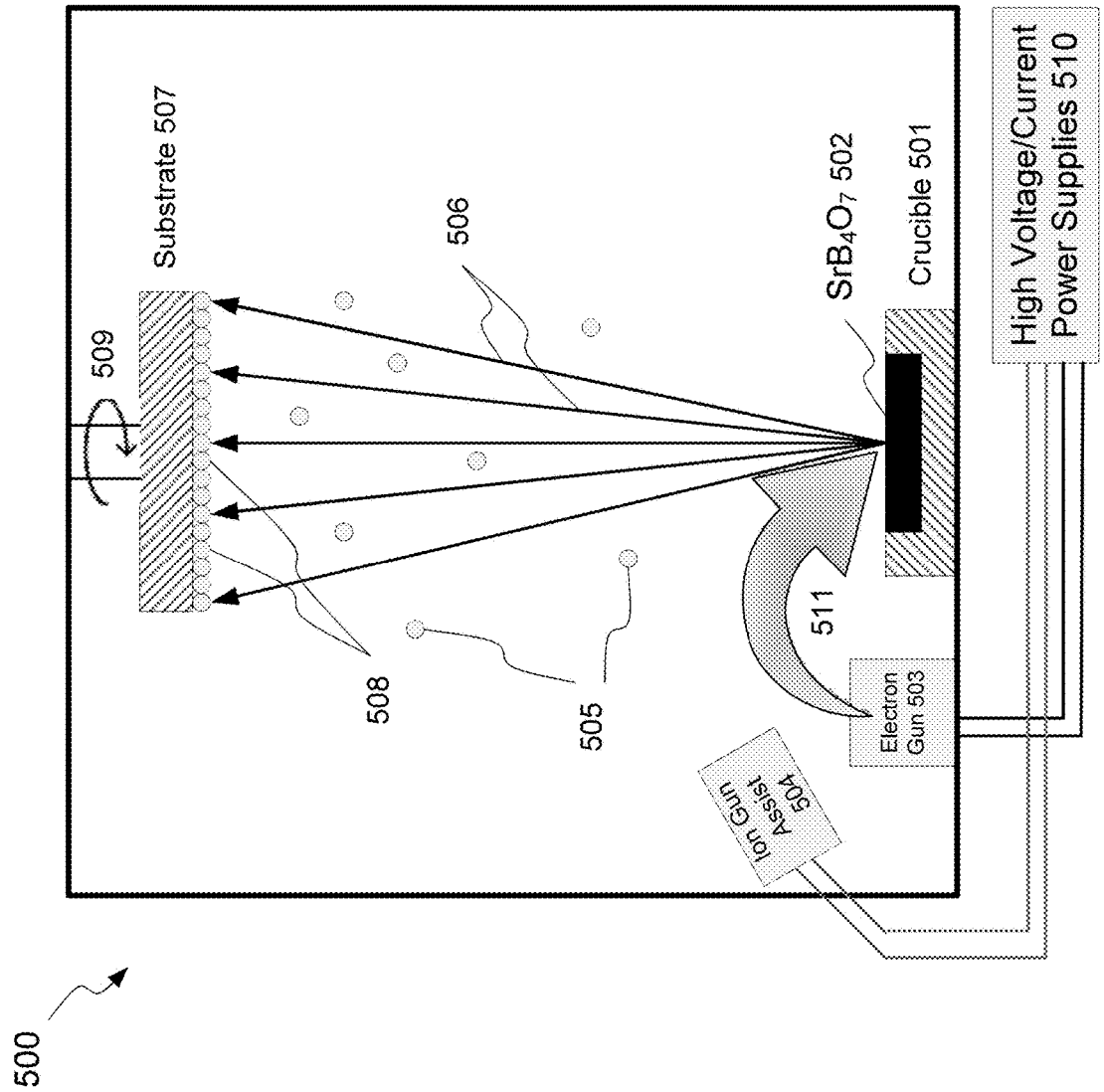
FIG. 5 illustrates an e-beam/ion beam sputtering coating chamber with $SrB_4O_7$ as a source material in accordance with the present disclosure.

FIG. 5 illustrates an electron-beam sputtering coating chamber with $SrB_4O_7$ as source material in accordance with the present disclosure. Electron-beam technology is widely used for coating substrates. In coating chamber 500, source material or coating material 502 comprising $SrB_4O_7$ is placed in a crucible 501. Alternatively, $SrB_4O_7$ can placed into a "pocket" in an electron gun. Electron gun 503 is located close to the crucible 501. Power supply 510 is applied to the electron gun 503 to cause electrons to bombard coating material 502 as indicated by arrow 511 such that $SrB_4O_7$ molecules 505 are released. Some of these molecules 508 travel toward the substrate 507 as indicated by arrows 506 and are deposited onto the substrate 507. The stream of electrons produced by electron gun 503 may be preferably steered by a series of electromagnets (not shown) onto the coating material $SrB_4O_7$ 502. To improve uniformity, the substrate 507 can be rotated as illustrated by arrow 509. Two or more substrates may be placed in the coating chamber 500 if there are multiple parts to be coated. To improve durability, the coating chamber 500 can be heated, and an ion beam gun 504 may be added, which is directed at the substrate 507 to increase coating density. Electron-beam systems are usually versatile and can be reconfigured from one coating type to another simply by changing the source material. When a multi-layer coating is desired, coating chamber 500 may include multiple crucibles (not shown) similar to crucible 501. Each crucible may contain a different material. A controller (not shown) may uncover different crucibles at different times in the coating process, for example by moving a shutter (not shown), or may otherwise direct the electron beam to the appropriate crucible at the appropriate time in order to achieve the desired coating structure on substrate 507.

FIG. 6 illustrates another optical component 600 having a non-linear optical crystal (substrate) 601 coated with $SrB_4O_7$ over its entire outer peripheral surface. In an embodiment of inspection or metrology system 100 shown in FIG. 1, illumination source 102 includes a laser that generates a deep UV wavelength such as a wavelength shorter than 300 nm. For example, illumination source 102 may include a laser configured to generate a wavelength close to 266 nm by generating a fourth harmonic of approximately 1064 nm wavelength light generated by a solid-state or fiber laser. The laser may generate a second harmonic of the 1064 nm light by using an appropriately configured lithium triborate (LBO) crystal. LBO is not hygroscopic and may be operated in air, even when laser power levels of tens of Watts are used. The fourth harmonic may be generated using a CLBO crystal configured to double the frequency of the second harmonic light. CLBO is hygroscopic and must be kept in a very low humidity environment at all times, whether the laser is operating or not. For high power operation, such as a fourth harmonic power of about 10 W or higher, it may be desirable to lower the oxygen level of the environment of the crystal well below that of the atmosphere in order to minimize surface damage to the crystal. By way of other examples, illumination source 102 may include a laser configured to generate a wavelength close to 213 nm or close to 193 nm by using harmonic generation and frequency summation in multiple non-linear optical crystals, as represented by frequency conversion crystal (optical component) 200-0. CLBO and CBO are the most useful materials for frequency conversion at such wavelengths, but both materials are hygroscopic. FIG. 6 illustrates a frequency conversion crystal 600 comprising a substrate 601 consisting of one of CLBO and CBO and configured to generate a deep UV wavelength, for example configured to double the frequency of light having a wavelength near 523 nm, or configured to sum the frequencies of light having wavelengths near 266 nm and near 1064 nm to generate light having a wavelength near 213 nm.

Referring to FIG. 6, an entire peripheral surface of non-linear crystal (CLBO or CBO) substrate 601 is covered (surrounded) by a layer 602 consisting essentially of $SrB_4O_7$. In the depicted example, crystal (CLBO or CBO) substrate 601 has a rectangular prism (cuboid) shape with opposing top and bottom surfaces 601T and 601B, opposing side surfaces 601S1 and 601S2, and opposing end surfaces 601E1 and 601E2, which respectively form light input and light output surfaces of frequency conversion crystal 600. In this example $SrB_4O_7$ layer 602 includes an unbroken cuboid structure having portions that extend over all six surfaces 601T, 601B, 601S1, 601S2, 601E1 and 601E2. FIG. 6A shows an exemplary frequency conversion crystal 600A in which an $SrB_4O_7$ layer 602A forms a single-layer coating directly on peripheral surface 601P (e.g., top and bottom surfaces 601T and 601B and end surfaces 601E1 and 601E2) of substrate 601. In other embodiments, the $SrB_4O_7$ layer may be part of a multi-layer encapsulating structure including one or more conventional optical material layers. For example, FIG. 6B shows another exemplary frequency conversion crystal 600B including a multi-layer coating structure in which a conventional optical material layer 603B is formed on the peripheral surface of substrate 601, and an $SrB_4O_7$ layer 602B is formed on layer 603B. FIG. 6C shows another exemplary frequency conversion crystal 600C with an alternative multi-layer coating structure in which $SrB_4O_7$ layer 602C is formed on the peripheral surface of substrate 601, and a conventional optical material layer 603C is formed on an outer peripheral surface 602P of layer 602C. In each example the thickness of $SrB_4O_7$ layer 602 is chosen to slow or prevent at least water from penetrating into crystal substrate 601. The thickness of $SrB_4O_7$ layer 602 may be approximately 10 nm or thicker, or approximately 100 nm. The thickness of $SrB_4O_7$ layer 602 need not be uniform as long as it is sufficiently thick to slow or prevent diffusion of at least water, and as long as the layer is free of pinholes. The thicknesses of the $SrB_4O_7$ layer on input surface 601E1 and output surface 601E2 may be further chosen to reduce reflectivity of one or more wavelengths used or generated in the frequency conversion. As indicated in FIGS. 6B and 6C, one or both of input surface 601E1 and output surface 601E2 may be coated with additional layers on top of or below the $SrB_4O_7$ layer to reduce reflectivity at one or more wavelengths of interest. The uniformity of the coatings on end surfaces 601E1 and 601E2 should be controlled to avoid too much variability in an optical property, such as a reflectivity, of those surfaces. Even if the $SrB_4O_7$ coating is not completely impervious to water and oxygen, if it slows diffusion of these molecules sufficiently, it may allow storage and/or operation of a hygroscopic non-linear crystal in an environment with higher water and oxygen content than an uncoated crystal, and therefore can reduce filtration and operating costs. Since crystal substrate 601 must be held during the coating process, in one embodiment, two coating operations are used to coat the entire surface.

Various modifications to the described embodiments will be apparent to those with skill in the art, and the general principles defined herein may be applied to other embodiments. Although it is expected that the optical coating material disclosed herein will be particularly useful in semiconductor inspection and metrology systems, it is also envisioned that these coatings and materials may be useful in other applications where VUV and DUV radiation are present, such as in an optical lithography system, and where visible or IR radiations are present, such as in an IR camera system.

The coating material and methods described herein are not intended to be limited to the particular embodiments shown and described but are to be accorded the widest scope consistent with the principles and novel features herein disclosed.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A method of fabricating an optical component, the method comprising:
    providing an optical component having a substrate;
    preparing the substrate;
    placing the optical component inside a coating chamber with the substrate to be coated facing toward a strontium tetraborate source;
    rotating the optical component inside the coating chamber;
    bombarding the strontium tetraborate source with electrons from an electron gun;
    the strontium tetraborate source and the electron gun being configured so that strontium tetraborate is released from the source and directed toward the substrate;
    forming a layer of strontium tetraborate on the substrate; and
    stopping the electron bombardment when a desired thickness of strontium tetraborate has been deposited on the substrate.

2. The method of claim 1, wherein the thickness is chosen so as to reduce the reflectivity of the substrate at a wavelength.

3. The method of claim 2, wherein the wavelength lies between 130 nm and 400 nm.

4. The method of claim 3, wherein the thickness is in the range of 30 nm to 200 nm.

5. The method of claim 1, wherein the thickness is chosen so as to increase the reflectivity of the substrate at a wavelength.

6. The method of claim 1, the method further comprising forming a second layer on the layer of strontium tetraborate.

7. The method of claim 6, wherein the second layer comprises at one of magnesium fluoride, calcium fluoride, aluminum fluoride and silicon dioxide.

* * * * *